(12) United States Patent
Suzuki et al.

(10) Patent No.: US 8,003,421 B2
(45) Date of Patent: Aug. 23, 2011

(54) METHOD FOR MANUFACTURING COMPOUND SEMICONDUCTOR SUBSTRATE, COMPOUND SEMICONDUCTOR SUBSTRATE AND LIGHT EMITTING DEVICE

(75) Inventors: Yukari Suzuki, Annaka (JP); Jun Ikeda, Annaka (JP); Masataka Watanabe, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/811,940

(22) PCT Filed: Jan. 14, 2009

(86) PCT No.: PCT/JP2009/000101
§ 371 (c)(1),
(2), (4) Date: Jul. 7, 2010

(87) PCT Pub. No.: WO2009/093418
PCT Pub. Date: Jul. 30, 2009

(65) Prior Publication Data
US 2010/0276709 A1 Nov. 4, 2010

(30) Foreign Application Priority Data
Jan. 25, 2008 (JP) .................. 2008-015449

(51) Int. Cl.
*H01L 21/00* (2006.01)
(52) U.S. Cl. .................. 438/47; 257/101; 257/E21.366
(58) Field of Classification Search .................... 438/37; 257/85, E21.366
See application file for complete search history.

(56) References Cited

U.S. PATENT DOCUMENTS

| 6,388,274 | B1 * | 5/2002 | Yoshinaga et al. .............. 257/79 |
| 6,586,773 | B2 | 7/2003 | Saeki et al. |
| 6,815,312 | B2 * | 11/2004 | Furukawa et al. ............ 438/455 |
| 6,846,686 | B2 | 1/2005 | Saeki et al. |
| 2003/0008430 | A1 | 1/2003 | Nakamura et al. |

FOREIGN PATENT DOCUMENTS

| JP | A-2000-196139 | 7/2000 |
| JP | A-2000-269145 | 9/2000 |

(Continued)

OTHER PUBLICATIONS

Feb. 10, 2009 Search Report issued in International Patent Application No. PCT/JP2009/000101 (with translation).

*Primary Examiner* — Chandra Chaudhari
(74) *Attorney, Agent, or Firm* — Oliff & Berridge, PLC

(57) ABSTRACT

A method for manufacturing a compound semiconductor substrate includes at least the processes of epitaxially growing a quaternary light emitting layer composed of AlGaInP on a GaAs substrate; vapor-phase growing a p-type GaP window layer on a first main surface of the quaternary light emitting layer, the first main surface being opposite to the GaAs substrate; removing the GaAs substrate; and epitaxially growing an n-type GaP window layer on a second main surface of the light emitting layer, the second main surface being located at a side where the GaAs substrate is removed. The method includes the process of performing a heat treatment under a hydrogen atmosphere containing ammonia after the process of removing the GaAs substrate and before the process of epitaxially growing the n-type GaP window layer.

8 Claims, 2 Drawing Sheets

FOREIGN PATENT DOCUMENTS

| | | |
|---|---|---|
| JP | A-2002-203987 | 7/2002 |
| JP | A-2003-23177 | 1/2003 |
| JP | A-2004-260109 | 9/2004 |
| JP | A-2004-296707 | 10/2004 |
| JP | A-2005-150664 | 6/2005 |
| JP | A-2005-277218 | 10/2005 |
| JP | A-2007-207932 | 8/2007 |
| WO | WO 2007/088841 A1 | 8/2007 |

* cited by examiner

METHOD FOR MANUFACTURING COMPOUND SEMICONDUCTOR SUBSTRATE, COMPOUND SEMICONDUCTOR SUBSTRATE AND LIGHT EMITTING DEVICE

TECHNICAL FIELD

The present invention relates to a method for manufacturing a compound semiconductor substrate, a compound semiconductor substrate and a light emitting device, and specifically, to a method for manufacturing a compound semiconductor substrate, a compound semiconductor substrate and a light emitting device for stably providing the light emitting device that can realize high-luminance and that has few defect, such as an increase in forward voltage (Vf) and stabilization voltage drop ($\Delta$Vf).

BACKGROUND ART

Conventionally, there has been known a light emitting device in which a light emitting layer section and a current spreading layer are formed on a GaAs single crystal substrate.

For example, there has been known the light emitting device in which the light emitting layer section composed of quaternary of AlGaInP and a window layer composed of GaP (hereinafter, merely referred to as a GaP window layer) on the GaAs single crystal substrate. The GaP window layer can be fabricated by relatively thinly forming a side of the light emitting layer section with the Metal Organic Vapor Phase Epitaxy method (hereinafter, merely referred to as the MOVPE method) and then relatively thickly forming the side of the light emitting layer section with the Hydride Vapor Phase Epitaxy method (hereinafter, merely referred to as the HVPE method). For example, there are cases of growing a GaP epitaxial layer having a thickness of approximately 200 µm as a whole.

Moreover, conventionally, there has been known the light emitting device in which the GaAs substrate, which is light absorbable, is removed and instead a GaP substrate, which is light transmissive, is bonded to realize higher luminance of the light emitting device composed of AlGaInP (See Japanese Patent Laid-open (Kokai) No. 2002-203987).

DISCLOSURE OF INVENTION

The foregoing technology of bonding the GaP substrate can achieve a certain degree of high-luminance. However, there is a problem such that processes become complex and thereby production cost becomes high.

In addition, there arises a defect such that forward voltage (Vf) of the light emitting device becomes high and thereby electric power consumption increases. Also, there is a problem such that stabilization voltage drop ($\Delta$Vf), which affects a switching characteristic, deteriorates. Here, the stabilization voltage drop ($\Delta$Vf) is an indicator showing a switching response characteristic in the case of driving the light emitting device with equal speed switching. When the forward voltage Vf just after starting applying current of 20 mA is defined as the initial value, the stabilization voltage drop ($\Delta$Vf) is an amount of change between the initial value and a stable value in the case that the current application continues after starting applying the current.

In order to solve the above-explained problems, it is an object of the present invention to provide a method for manufacturing a compound semiconductor substrate, a compound semiconductor substrate and a light emitting device that can realize the semiconductor light emitting device having a good forward voltage (Vf) and stabilization voltage drop ($\Delta$Vf) and that can reduce production cost.

To achieve this object, the present invention provides a method for manufacturing a compound semiconductor substrate, including at least the processes of epitaxially growing a quaternary light emitting layer composed of AlGaInP on a GaAs substrate; vapor-phase growing a p-type GaP window layer on one of main surfaces (a first main surface) of the quaternary light emitting layer, the first main surface being opposite to the GaAs substrate; removing the GaAs substrate; and epitaxially growing an n-type GaP window layer on the other main surface (a second main surface) of the light emitting layer, the second main surface being located at a side where the GaAs substrate is removed; wherein the method comprising the process of performing a heat treatment under a hydrogen atmosphere containing ammonia after the process of removing the GaAs substrate and before the process of epitaxially growing the n-type GaP window layer.

The present invention is characterized by performing the process of the heat treatment under the hydrogen atmosphere containing ammonia after the process of removing the GaAs substrate and before the process of epitaxially growing the n-type GaP window layer when manufacturing the compound semiconductor substrate.

The present inventors found that in a conventional manufacturing method of bonding the GaP substrate, oxide films of several dozen Å (a few nm) exist on both bonding interfaces between the quaternary light emitting layer and the GaP substrate, a concentration of impurities, such as carbon, is not constant to a certain degree and is unstable in every manufacture batch. The oxide films and the carbon adhering to the interfaces cause the defect of the increase in the Vf and $\Delta$Vf of the bonding interfaces. On the other hand, a carbon concentration and an oxygen concentration of the second main surface of the quaternary light emitting layer, that is, an interface between the quaternary light emitting layer and the n-type GaP window layer can be reduced by epitaxially growing the n-type GaP window layer and performing the heat treatment under the hydrogen atmosphere containing the ammonia before the epitaxial growth as in the present invention, and thereby the compound semiconductor substrate having a good forward voltage (Vf) and stabilization voltage drop ($\Delta$Vf), which is used for a high-luminance light emitting device, can be manufactured.

In addition, an incidence of the Vf and $\Delta$Vf defect can be reduced and a complex process, such as bonding, can be omitted and a manufacturing yield can be therefore improved and the manufacturing cost can be reduced.

Moreover, in the process of performing the heat treatment under the hydrogen atmosphere containing the ammonia, the heat treatment is preferably performed at a temperature region of 300° C. or more for 10 minutes or more in total.

In this manner, when the heat treatment is performed at a temperature region of 300° C. or more for 10 minutes or more in total, the carbon concentration and the oxygen concentration of the interface (the second main surface) between the quaternary light emitting layer and the n-type GaP window layer can be more reduced, and thereby the compound semiconductor substrate having a better forward voltage (Vf) and stabilization voltage drop ($\Delta$Vf) can be manufactured.

Moreover, a volume content of the ammonia is preferably 0.01% or more in the hydrogen atmosphere containing the ammonia.

In this manner, when the heat treatment is performed under the hydrogen atmosphere in which the volume content of the ammonia is 0.01% or more, the carbon concentration and the oxygen concentration of the second main surface can be efficiently reduced.

Furthermore, the present invention provides a compound semiconductor substrate comprising at least a quaternary light emitting layer composed of AlGaInP; a p-type GaP window layer formed on one of main surfaces (a first main surface) of the quaternary light emitting layer; and an n-type GaP window layer formed on the other main surface (a second main surface) of the quaternary light emitting layer; wherein the second main surface of the quaternary light emitting layer is an interface between the quaternary light emitting layer and the n-type GaP window layer, and has a carbon concentration of $1.0 \times 10^{17}/cm^3$ or less and an oxygen concentration of $1.0 \times 10^{19}/cm^3$ or less.

In this manner, the present invention provides the compound semiconductor substrate having a carbon concentration of $1.0 \times 10^{17}/cm^3$ or less and an oxygen concentration of $1.0 \times 10^{19}/cm^3$ or less of the second main surface of the quaternary light emitting layer.

In the conventional manufacturing method of bonding the GaP substrate, the carbon and oxygen concentration of the interface (the second main surface) between the quaternary light emitting layer and the n-type GaP window layer are $8.0 \times 10^{18}$ to $2.0 \times 10^{19}/cm^3$ and $2.0 \times 10^{19}$ to $1.0 \times 10^{21}/cm^3$ respectively. On the other hand, in the compound semiconductor substrate according to the present invention, the carbon concentration of the second main surface of the quaternary light emitting layer is $1.0 \times 10^{17}/cm^3$ or less and the oxygen concentration thereof is $1.0 \times 10^{19}/cm^3$ or less. Such compound semiconductor substrate can be the light emitting device having a good forward voltage (Vf) and stabilization voltage drop ($\Delta$Vf) with high-luminance.

Moreover, since the forward voltage (Vf) and the stabilization voltage drop ($\Delta$Vf) are good, the compound semiconductor substrate has a low incidence of the defect, and can thereby achieve improvement of the manufacturing yield and reduction of the manufacturing cost.

Here, the carbon concentration and the oxygen concentration of the second main surface in the present invention mean the carbon concentration and the oxygen concentration on the second main surface and in its vicinity respectively.

Moreover, the second main surface of the quaternary light emitting layer preferably has a carbon concentration of $1.0 \times 10^{17}/cm^3$ or less and an oxygen concentration of $1.0 \times 10^{18}/cm^3$ or less.

In this manner, when the second main surface has a carbon concentration of $1.0 \times 10^{17}/cm^3$ or less and an oxygen concentration of $1.0 \times 10^{18}/cm^3$ or less, the compound semiconductor substrate can be a high-luminance light emitting device having a better forward voltage (Vf) and stabilization voltage drop ($\Delta$Vf).

Furthermore, the present invention provides a light emitting device fabricated by using the compound semiconductor substrate described in the present invention.

As described above, the compound semiconductor substrate according to the present invention has a sufficiently low level of the carbon concentration and the oxygen concentration of the interface (the second main surface) between the quaternary light emitting layer and the n-type GaP window layer, and therefore the light emitting device fabricated by using the compound semiconductor substrate can have a good forward voltage (Vf) and stabilization voltage drop ($\Delta$Vf) with high-luminance.

As explained above, the method for manufacturing a compound semiconductor substrate according to the present invention can more reduce the carbon concentration and the oxygen concentration of the interface between the quaternary light emitting layer and the n-type GaP window layer than the conventional manufacturing method of bonding the GaP substrate, and therefore can manufacture the compound semiconductor substrate that enables the forward voltage (Vf) and the stabilization voltage drop ($\Delta$Vf) to be better than a conventional substrate. In addition, an incidence of the defect can be reduced, therefore the manufacturing yield can be improved and the manufacturing cost can be reduced.

BEST MODE FOR CARRYING OUT THE INVENTION

Hereinafter, the present invention will be explained in more detail.

As mentioned above, it had been desired to develop the compound semiconductor substrate and the method for manufacturing thereof that can realize the semiconductor light emitting device having a good forward voltage (Vf) and stabilization voltage drop ($\Delta$Vf) and that can reduce manufacturing cost.

In view of this, the present inventors repeatedly keenly conducted studies of the cause of the increase in the forward voltage (Vf) and the stabilization voltage drop ($\Delta$Vf) of the light emitting device.

As a result, the present inventors found that in the conventional manufacturing method of bonding the GaP substrate, the oxide films of several dozen Å (a few nm) exist on both bonding interfaces of the quaternary light emitting layer and the GaP substrate, the concentration of impurities, such as carbon, is different and unstable in every manufacture batch. The present inventors also found that the Vf and $\Delta$Vf increase in the bonding interfaces due to existence of the oxide films and the carbon adhering to the interfaces, and thereby the defect occurs. The oxide films and the carbon adhering to the interfaces can be reduced by chemical etching or a high temperature annealing at 400° C. or more. However, once the substrate is taken out under the atmosphere, the oxide films are regrown and the carbon adheres again immediately.

Moreover, the bonding process requires a careful operation to prevent an orientation difference between the quaternary light emitting layer and the GaP substrate. Accordingly, in the case of the operation of bonding a plurality of the substrates parallel, the start time of bonding varies from 15 minutes to 40 minutes. The variation of a thickness of the oxide films and the carbon concentration occur in every bonding batch. When the variation exceeds a certain period of time, Vf and $\Delta$Vf quality exceed a permissible range and become defect. There is a method for preventing the regrowth of the oxide films and the re-adhesion of the carbon, such as vacuum storage. However, this method is not preferable from the viewpoint of workability and productivity.

In view of this, further the present inventors repeatedly keenly conducted studies, consequently found that the carbon concentration and the oxide film of a growth interface can be greatly reduced by epitaxially growing the n-type GaP window layer instead of bonding and by performing the heat treatment under the hydrogen atmosphere containing the ammonia after removing the GaAs substrate and before forming the n-type GaP window layer, and thereby bringing the present invention to completion.

Figure 1:
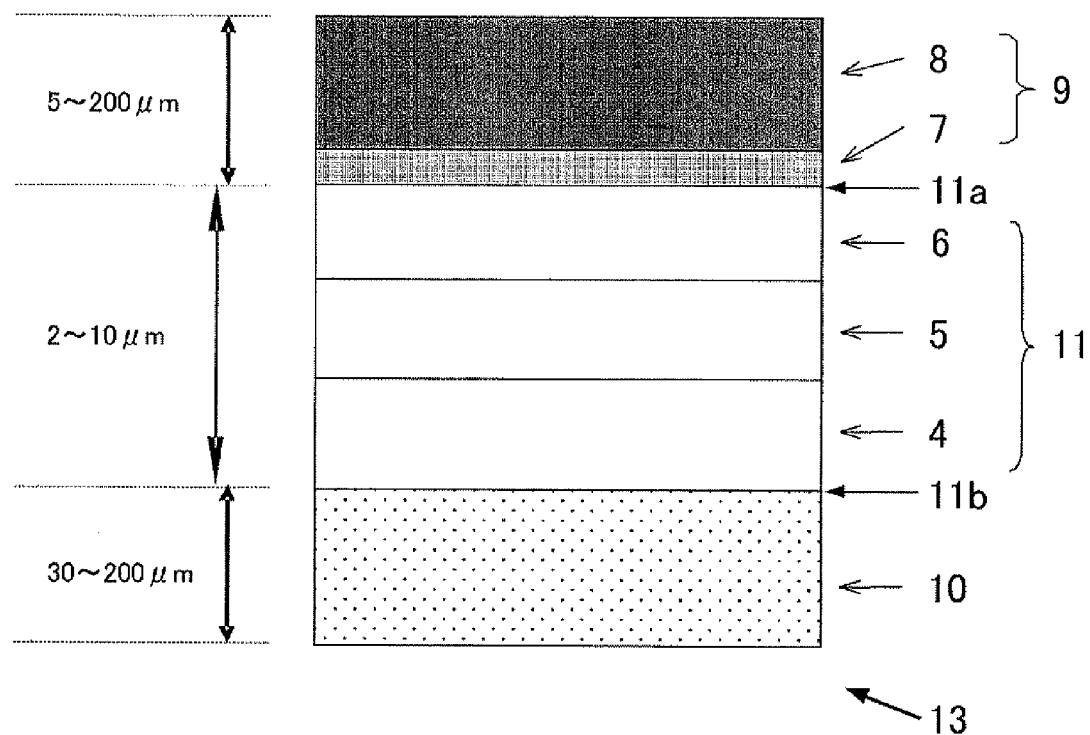
FIG. 1 is a schematic view showing an example of the compound semiconductor substrate according to the present invention.

Hereinafter, the present invention will be explained in detail referring to FIG. 1 and FIG. 2. However, the present invention is not restricted thereto. FIG. 1 is a schematic view showing an example of the compound semiconductor substrate according to the present invention.

The compound semiconductor substrate 13 according to the present invention includes at least the quaternary light emitting layer 11 having a thickness of approximately 2 to 10 µm, the p-type GaP window layer 9 having a thickness of approximately 5 to 200 µm, which is composed of a p-type GaP layer 7 and a p-type GaP epitaxial layer 8, and the n-type GaP window layer 10 having a thickness of approximately 30 to 200 µm. This quaternary light emitting layer 11 has an n-type cladding layer 4 having a thickness of approximately 0.8 to 4 µm, an active layer 5 having a thickness of approximately 0.4 to 2 µm, and a p-type cladding layer 6 having a thickness of approximately 0.8 to 4 µm, respectively composed of AlGaInP. It is to be noted that in the quaternary light emitting layer 11, a surface of the p-type cladding layer 6 side is the first main surface 11a and a surface of the n-type cladding layer 4 side is the second main surface 11b. The first main surface 11a is the interface between the quaternary light emitting layer 11 and the p-type GaP window layer 9, and the second main surface 11b is the interface between the quaternary light emitting layer 11 and the n-type GaP window layer 10.

Here, the quaternary light emitting layer in the present invention is a layer composed of Groups III-V compound semiconductor material in which three Group III elements of Al, Ga and In, and a Group V element of P are used.

Additionally, the second main surface 11b of the quaternary light emitting layer 11 has a carbon concentration of $1.0 \times 10^{17}/cm^3$ or less and an oxygen concentration of $1.0 \times 10^{19}/cm^3$ or less.

As described above, in the compound semiconductor substrate in which the second main surface of the quaternary light emitting layer has a carbon concentration of $1.0 \times 10^{17}/cm^3$ or less and an oxygen concentration of $1.0 \times 10^{19}/cm^3$ or less, the carbon concentration of the interface between the GaP window layer and the quaternary light emitting layer 11 is not more than approximately 1/100 and the oxygen concentration thereof is not more than approximately 1/2 in comparison with the conventional substrate manufactured by bonding the GaP window layer. The compound semiconductor substrate enables the light emitting device having a better forward voltage (Vf), a better stabilization voltage drop (ΔVf) and higher luminance than a conventional light emitting device to be fabricated by use of the compound semiconductor substrate as described above.

Moreover, the compound semiconductor substrate has a good forward voltage (Vf) and stabilization voltage drop (ΔVf), that is, the compound semiconductor substrate can keep an incidence of the Vf and ΔVf defect low, and thereby achieve improvement of the manufacturing yield and reduction of the manufacturing cost.

Here, in the present invention, the second main surface of the quaternary light emitting layer can have a carbon concentration of $1.0 \times 10^{17}/cm^3$ or less and an oxygen concentration of $1.0 \times 10^{18}/cm^3$ or less.

As described below in detail, the method for manufacturing a compound semiconductor substrate according the present invention can obtain the compound semiconductor substrate in which the carbon concentration of the second main surface is $1.0 \times 10^{17}/cm^3$ or less and the oxygen concentration thereof is $1.0 \times 10^{18}/cm^3$ or less. The compound semiconductor substrate can be therefore a high-luminance light emitting device having a better forward voltage (Vf) and stabilization voltage drop (ΔVf).

Here, it is more desirable that a lower limit of the carbon concentration and the oxygen concentration of the second main surface is a lower value. However, since it is difficult to be a carbon concentration of $1.0 \times 10^{13}/cm^3$ or less and an oxygen concentration of $1.0 \times 10^{14}/cm^3$ or less, the lower limit is preferably the value described above.

The compound semiconductor substrate according to the present invention as described above can be manufactured by a method for manufacturing a compound semiconductor substrate exemplified below, but the present invention is not of course restricted thereto. Here, FIG. 2 is a process flow chart showing an example of the method for manufacturing a compound semiconductor substrate according to the present invention.

(Process A)

Figure 2:
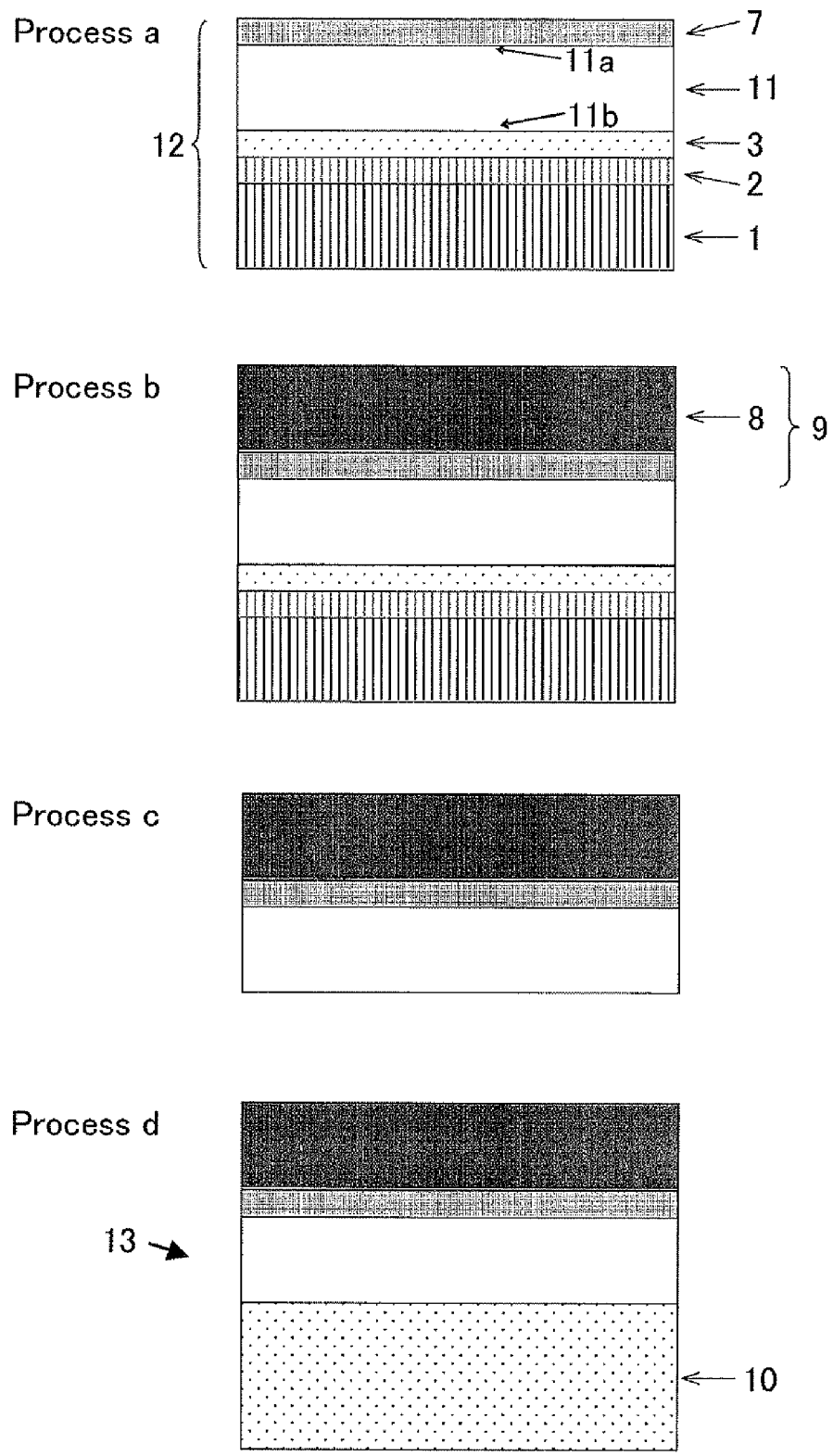
FIG. 2 is a process flow chart showing an example of the method for manufacturing a compound semiconductor substrate according to the present invention.

First, as shown in process a of FIG. 2, the n-type GaAs substrate 1 is prepared, cleaned and then placed on a MOVPE reactor etc. An n-type AlInP etching stop layer 3 in addition to an n-type GaAs buffer layer 2 are epitaxially grown on the GaAs substrate 1 while a material gas containing Ga, As, Al, In, P and the like is introduced.

Next, as the quaternary light emitting layer 11, the n-type cladding layer having a thickness of approximately 0.8 to 4 µm, the active layer having a thickness of approximately 0.4 to 2 µm, and the p-type cladding layer having a thickness of approximately 0.8 to 4 µm, respectively composed of AlGaInP are epitaxially grown in this order, for example, by the MOVPE method. Moreover, the p-type GaP layer 7 having a thickness of approximately 0.05 to 1 µm is epitaxially grown on the p-type cladding layer so that a MO epitaxial substrate 12 is obtained. A surface of a p-type cladding layer side, that is, a surface opposite to the GaAs substrate 1 is the first main surface 11a of the quaternary light emitting layer 11.

It is to be noted that manufacturing conditions to form each of the epitaxial layers can be appropriately selected in accordance with a required thickness or a composition ratio of the epitaxial layers.

Here, as a material gas available for sources of the individual components Al, Ga, In (indium), P (phosphorus) and As (arsenic) that is used for the epitaxial growth in each layer, the following can be used for example.

Al source gas: trimethyl aluminum (TMAl), triethyl aluminum (TEAl), etc.
Ga source gas: trimethyl gallium (TMGa), triethyl gallium (TEGa), etc.
In source gas: trimethyl indium (TMIn), triethyl indium (TEIn), etc.
P source gas: trimethyl phosphorus (TMP), triethyl phosphorus (TEP), phosphine ($PH_3$), etc. and
As source gas: arsine ($AsH_3$), etc.

As a dopant gas, the following can be used for example.
(P-Type Dopant)
Mg source: Bis(cyclopentadienyl)magnesium ($Cp_2Mg$), etc.
Zn source: dimethyl zinc (DMZn), diethyl zinc (DEZn), etc.
(N-Type Dopant)
Si source: silicon hydroxide such as monosilane, etc.

(Process B)

Next, a thick p-type GaP epitaxial layer 8 having a thickness of approximately 5 to 200 µm is vapor-phase grown on the MO epitaxial substrate 12, for example, by the HVPE method so that the p-type GaP window layer 9 is formed.

Specifically, in the HVPE method, first while metal Ga, which is a Group III element, is held in a container and heated to a predetermined temperature, hydrogen chloride is introduced on the metal Ga, and thereby GaCl is generated according to reaction shown in the following formula (1). Then, GaCl is supplied to the substrate together with $H_2$ gas, which is a carrier gas.

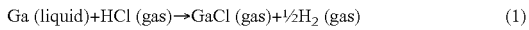
$$Ga \text{ (liquid)} + HCl \text{ (gas)} \rightarrow GaCl \text{ (gas)} + \tfrac{1}{2}H_2 \text{ (gas)} \quad (1)$$

A growth temperature is set, for example, at not less than 640° C. and not more than 860° C. Regarding P, which is a Group V element, $PH_3$ is supplied to the substrate together with $H_2$ gas, which is a carrier gas. Zn, which is p-type dopant, is supplied in the form of DMZn (dimethyl zinc) so that the p-type GaP epitaxial layer 8 is formed according to reaction shown in the following formula (2).

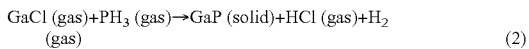
$$GaCl \text{ (gas)} + PH_3 \text{ (gas)} \rightarrow GaP \text{ (solid)} + HCl \text{ (gas)} + H_2 \text{ (gas)} \quad (2)$$

(Process C)

After the process b, the GaAs substrate 1, the GaAs buffer layer 2 and the n-type AlInP etching stop layer 3 is removed by etching using a chemical solution such as sulfuric acid and hydrogen peroxide. It is to be noted that an AlGaInP surface of the quaternary light emitting layer 11 that is exposed by the etching removal is the second main surface 11b.

(Process D)

Next, the substrate composed of the quaternary light emitting layer 11 and the p-type GaP window layer 9 is introduced into a HVPE reactor. After the inner atmosphere of a furnace is substituted with the hydrogen atmosphere, supply of ammonia gas is started together with starting an increase in temperature, and the heat treatment is performed.

Here, a process of the increase in temperature under the hydrogen atmosphere containing the ammonia can be performed at a temperature region of 300° C. or more for 10 minutes or more in total. After the passage of 10 minutes or more, the supply of the ammonia gas is stopped.

By the heat treatment under the hydrogen atmosphere containing the ammonia in the conditions as described above, the carbon concentration of the interface (the second main surface 11b) between the quaternary light emitting layer 11 and the n-type GaP window layer 10 can be $1.0 \times 10^{17}/cm^3$ or less and the oxygen concentration thereof can be $1.0 \times 10^{19}/cm^3$ or less, in particular $1.0 \times 10^{18}/cm^3$ or less. Therefore, the compound semiconductor substrate can be obtained which can be a high-luminance light emitting device having a better forward voltage (Vf) and stabilization voltage drop (ΔVf).

It is more preferably set that the substrate is held for 20 to 30 minutes in total.

Moreover, a volume content of the ammonia can be at least 0.01% or more in the hydrogen atmosphere containing the ammonia.

As described above, when the heat treatment is performed under the hydrogen atmosphere in which the volume content of the ammonia is 0.01% or more, the carbon concentration and the oxygen concentration of the interface between the quaternary light emitting layer and the n-type GaP layer can be further reduced.

The atmosphere in which the volume content of the ammonia is not less than 0.03% and not more than 1.0% is more preferable.

Successively, the n-type GaP window layer 10 for taking out light emitted at the quaternary light emitting layer 11 is grown on the second main surface 11b with a thickness of approximately 30 to 200 μm.

The compound semiconductor substrate 13 that can realize the semiconductor light emitting device having a good forward voltage (Vf) and stabilization voltage drop (ΔVf) is obtained by the above-mentioned processes.

Here, the compound semiconductor substrate 13 as described above is sliced and worked into the chips, and a high-luminance light emitting device can be obtained by attaching electrodes to the chip and the like.

As mentioned above, the compound semiconductor substrate according to the present invention has a sufficiently low level of the carbon concentration and the oxygen concentration of the interface (the second main surface) between the quaternary light emitting layer and the n-type GaP window layer, and therefore the light emitting device fabricated by using the compound semiconductor substrate can have high-luminance, a good forward voltage (Vf) and a good stabilization voltage drop (ΔVf).

As described above, in the conventional manufacturing method of bonding the GaP substrate, limits of the carbon and oxygen concentration of the interface between the quaternary light emitting layer and the n-type GaP window layer are $8.0 \times 10^{18}$ to $2.0 \times 10^{19}/cm^3$ and $2.0 \times 10^{19}$ to $1.0 \times 10^{21}/cm^3$ respectively. In contrast to this, the carbon concentration can be $1.0 \times 10^{17}/cm^3$ or less and the oxygen concentration can be $1.0 \times 10^{19}/cm^3$ or less by the method for manufacturing a compound semiconductor substrate according to the present invention. Thus, the carbon concentration and the oxygen concentration of the interface between the quaternary light emitting layer and the n-type GaP window layer can be more reduced than the conventional method. Consequently, the compound semiconductor substrate enables the manufacture of the light emitting device having a remarkably better forward voltage (Vf) and stabilization voltage drop (ΔVf) with high-luminance than a conventional device.

Hereinafter, the present invention will be explained in more detail based on Examples and Comparative Example, but the present invention is not of course restricted thereto.

EXAMPLE 1

According to the process shown in FIG. 2 as described above, the n-type AlInP etching stop layer 3 having a thickness of 0.5 μl in addition to the n-type GaAs buffer layer 2 having a thickness of 0.5 μm were epitaxially grown on the GaAs single crystal substrate 1 having a thickness of 280 μm. Next, as the light emitting layer 11, the n-type cladding layer having a thickness of 1.0 μm, the active layer having a thickness of 0.6 μm, and the p-type cladding layer having a thickness of 1.0 μm, respectively composed of AlGaInP were epitaxially grown in this order by the MOVPE method.

Furthermore, the p-type GaP layer 7 having a thickness of 0.1 μm was epitaxially grown on the p-type cladding layer so that the MO epitaxial substrate 12 was obtained. As the material gas for the foregoing epitaxial growth, trimethyl gallium (TMGa), trimethyl indium (TMIn), trimethyl aluminum (TMAl), phosphine ($PH_3$) and arsine ($AsH_3$) were used.

Next, the p-type GaP epitaxial layer 8 of approximately 150 μm was vapor-phase grown on the MO epitaxial substrate 12 by the HVPE method.

Next, the GaAs substrate 1 was removed by etching using a mixed chemical solution composed of sulfuric acid and hydrogen peroxide, and thereafter placing on the HVPE reactor. Then, the temperature increase was started with supplying $H_2$ gas into the HVPE reactor, and the supply of the ammonia gas was started simultaneously with the temperature increase. An ammonia concentration in the furnace reached 0.05% approximately at the same time of the start of the supply of the ammonia gas. After 10 minutes from reaching a furnace temperature of 300° C., the supply of the ammonia gas was stopped.

After that, when the furnace temperature reached a predetermined 710° C. by the temperature increase, the growth of the n-type GaP window layer 10 was started and the n-type GaP window layer 10 of 200 μm was formed to manufacture the compound semiconductor substrate 13.

The following evaluation was made to evaluate the compound semiconductor substrate manufactured as described above.

First, the carbon concentration and the oxygen concentration of the interface (the second main surface) between the quaternary light emitting layer and the n-type GaP window layer of the compound semiconductor substrate were evaluated by SIMS (Secondary Ion Mass Spectroscopy).

In order to evaluate the forward voltage (Vf) and the stabilization voltage drop (ΔVf) of the manufactured compound semiconductor substrate, the compound semiconductor substrate manufactured was sliced and worked into the chips of 200 μm square. The electrodes were attached to the chips to fabricate the light emitting devices. Vf of three light emitting devices (the center portion of the substrate (one), the peripheral portion (two)) among them were measured by applying current of 20 mA with a constant current power source. Voltage just after the start of applying current was defined as an initial value, and thereafter an amount of change between the initial value and a stable value when the current application continues, that is, the stabilization voltage drop (ΔVf) was measured.

EXAMPLE 2

The compound semiconductor substrate was manufactured in the same conditions as Example 1 except that the supply time of the ammonia gas after reaching a furnace temperature of 300° C. was 20 minutes in Example 1, and the same evaluation as Example 1 was made.

COMPARATIVE EXAMPLE 1

The compound semiconductor substrate was manufactured in the same conditions as Example 1 until removing the GaAs single crystal substrate in Example 1, and thereafter the heat treatment under the hydrogen atmosphere containing the ammonia did not performed and a separately prepared GaP substrate was bonded instead of the growth of the n-type GaP window layer 10 so that the compound semiconductor substrate was manufactured. The same evaluation as Example 1 was made for the manufactured compound semiconductor substrate.

As a result of the evaluation of the carbon concentration and the oxygen concentration of the second main surface of the compound semiconductor substrate in Example 1, the carbon concentration was $1.4\times10^{16}/cm^3$, and the oxygen concentration was $2.0\times10^{18}/cm^3$. In the compound semiconductor substrate in Example 2, the carbon concentration was $9.5\times10^{15}/cm^3$, and the oxygen concentration was $5.6\times10^{17}/cm^3$. The results of both Examples were thus very good. The compound semiconductor substrate in Example 2 was able to more reduce the carbon concentration and the oxygen concentration of the second main surface due to longer time of the heat treatment under the hydrogen atmosphere containing the ammonia than Example 1.

In contrast to this, in the compound semiconductor substrate in Comparative Example 1, the carbon concentration was $1.0\times10^{19}/cm^3$, and the oxygen concentration was $1.2\times10^{21}/cm^3$, which were quite higher values than Example 1 and 2.

The forward voltage (Vf) and the stabilization voltage drop (ΔVf) of the light emitting devices fabricated by using the compound semiconductor substrates in Example 1, 2 and Comparative Example 1 were evaluated. The results of the light emitting device fabricated by using the compound semiconductor substrate in Example 1 were Vf=1.93 to 1.95 V and ΔVf=30 to 60 mV, which were almost good. The results in Example 2 were Vf=1.92 to 1.94 V and ΔVf=10 to 40 mV, which were better values because the carbon concentration and the oxygen concentration of the second main surface further decreased than the compound semiconductor substrate in Example 1.

In contrast to this, the results in Comparative Example 1 were Vf=1.97 to 2.35 V and ΔVf=160 to 205 mV. Both Vf and ΔVf were unstable and bigger values than Example 1 and 2.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a compound semiconductor substrate, including at least the processes of epitaxially growing a quaternary light emitting layer composed of AlGaInP on a GaAs substrate; vapor-phase growing a p-type GaP window layer on one of main surfaces (a first main surface) of the quaternary light emitting layer, the first main surface being opposite to the GaAs substrate; removing the GaAs substrate; and epitaxially growing an n-type GaP window layer on the other main surface (a second main surface) of the light emitting layer, the second main surface being located at a side where the GaAs substrate is removed; wherein
the method comprising the process of performing a heat treatment under a hydrogen atmosphere containing ammonia after the process of removing the GaAs substrate and before the process of epitaxially growing the n-type GaP window layer.

2. The method for manufacturing a compound semiconductor substrate according to claim 1, wherein in the process of performing the heat treatment under the hydrogen atmosphere containing the ammonia, the heat treatment is performed at a temperature region of 300° C. or more for 10 minutes or more in total.

3. The method for manufacturing a compound semiconductor substrate according to claim 1, wherein a volume content of the ammonia is 0.01% or more in the hydrogen atmosphere containing the ammonia.

4. The method for manufacturing a compound semiconductor substrate according to claim 2, wherein a volume content of the ammonia is 0.01% or more in the hydrogen atmosphere containing the ammonia.

5. A compound semiconductor substrate comprising at least a quaternary light emitting layer composed of AlGaInP; a p-type GaP window layer formed on one of main surfaces (a first main surface) of the quaternary light emitting layer; and an n-type GaP window layer formed on the other main surface (a second main surface) of the quaternary light emitting layer; wherein
the second main surface of the quaternary light emitting layer is an interface between the quaternary light emitting layer and the n-type GaP window layer, and has a carbon concentration of $1.0 \times 10^{17}/cm^3$ or less and an oxygen concentration of $1.0 \times 10^{19}/cm^3$ or less.

6. The compound semiconductor substrate according to claim 5, wherein the second main surface of the quaternary light emitting layer has a carbon concentration of $1.0 \times 10^{17}/cm^3$ or less and an oxygen concentration of $1.0 \times 10^{18}/cm^3$ or less.

7. A light emitting device fabricated by using the compound semiconductor substrate according to claim 5.

8. A light emitting device fabricated by using the compound semiconductor substrate according to claim 6.

* * * * *